(12) United States Patent
Ojha et al.

(10) Patent No.: US 9,819,332 B2
(45) Date of Patent: Nov. 14, 2017

(54) CIRCUIT FOR REDUCING NEGATIVE GLITCHES IN VOLTAGE REGULATOR

(71) Applicant: FREESCALE SEMICONDUCTOR, INC., Austin, TX (US)

(72) Inventors: Ashish Ojha, Lacknow (IN); Parul K. Sharma, Noida (IN)

(73) Assignee: NXP USA, INC., Austin, TX (US)

(*) Notice: Subject to any disclaimer, the term of this patent is extended or adjusted under 35 U.S.C. 154(b) by 48 days.

(21) Appl. No.: 15/050,445

(22) Filed: Feb. 22, 2016

(65) Prior Publication Data

US 2017/0244395 A1    Aug. 24, 2017

(51) Int. Cl.
*H03K 5/007*    (2006.01)
*H03K 5/153*    (2006.01)
*H03K 17/16*    (2006.01)
*H03K 17/22*    (2006.01)

(52) U.S. Cl.
CPC ............. *H03K 5/007* (2013.01); *H03K 5/153* (2013.01)

(58) Field of Classification Search
CPC ...... H03K 5/007; H03K 5/153; H03K 17/165; H03K 17/22; H03K 17/223
USPC ....... 327/310, 332, 537, 538, 540, 541, 543, 327/551
See application file for complete search history.

(56) References Cited

U.S. PATENT DOCUMENTS

| | | | |
|---|---|---|---|
| 3,048,768 A | 8/1962 | Conger | |
| 4,093,908 A | 6/1978 | Evans | |
| 4,412,279 A | 10/1983 | Franklin | |
| 5,247,240 A * | 9/1993 | Kayser | H02M 3/156 323/288 |
| 6,522,111 B2 | 2/2003 | Zadeh et al. | |
| 6,933,772 B1 | 8/2005 | Bannerjee et al. | |
| 7,199,565 B1 | 4/2007 | Demolli | |
| 7,652,455 B2 | 1/2010 | Demolli | |
| 8,319,548 B2 | 11/2012 | Rarnaraju | |
| 8,344,713 B2 | 1/2013 | Shrivas et al. | |

* cited by examiner

*Primary Examiner* — Lincoln Donovan
*Assistant Examiner* — Colleen O Toole
(74) *Attorney, Agent, or Firm* — Charles E. Bergere

(57) ABSTRACT

A circuit that stabilizes an output signal of a voltage regulator includes a glitch amplifier, a pulse generator, and a transistor. The glitch amplifier amplifies glitches in the output signal and generates a glitch amplifier output signal. The pulse generator receives the glitch amplifier output signal and generates a control signal. When there is a positive glitch in the output signal and a voltage level of the glitch amplifier output signal is less than a first threshold voltage, the pulse generator deactivates the control signal, which turns off the transistor. When there is a negative glitch in the output signal and the voltage level of the glitch amplifier output signal is greater than a second threshold voltage, the pulse generator activates the control signal, which turns on the transistor and provides a compensating current surge to reduce a voltage droop in the output signal.

17 Claims, 3 Drawing Sheets

CIRCUIT FOR REDUCING NEGATIVE GLITCHES IN VOLTAGE REGULATOR

BACKGROUND

The present invention generally relates to voltage regulator circuits, and, more particularly, to a circuit for reducing negative glitches in an output signal of a voltage regulator.

Electronic circuits typically include a voltage regulator that regulates a supply voltage and prevents variations in the supply voltage from propagating to the components of the electronic circuits. However, if the load current changes (i.e., when a current step occurs), the voltage of an output signal of the voltage regulator changes and settles at its desired value after a delay, which occurs due to a feedback operation of the voltage regulator. Such instances generally occur during start-up of a component or switching of a component from one power mode to another. Decreases in the operating voltages and increases in the operating speeds of electronic circuits requires the voltage regulator to respond quickly to the load variations.

One technique to overcome the aforementioned problem is to increase the size of a decoupling capacitor of the regulator circuit, but this results in a significant increase in the circuit area.

Another technique to overcome the aforementioned problem involves reducing the transient response time of the voltage regulator by decreasing the delay caused by the feedback operation. However, this requires including more components in the voltage regulator and requires modification of the voltage regulator design. It also increases the complexity of the voltage regulator, and the power consumption.

It would be advantageous to have a better way to reduce glitches in the output signal of the voltage regulator during load variations.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
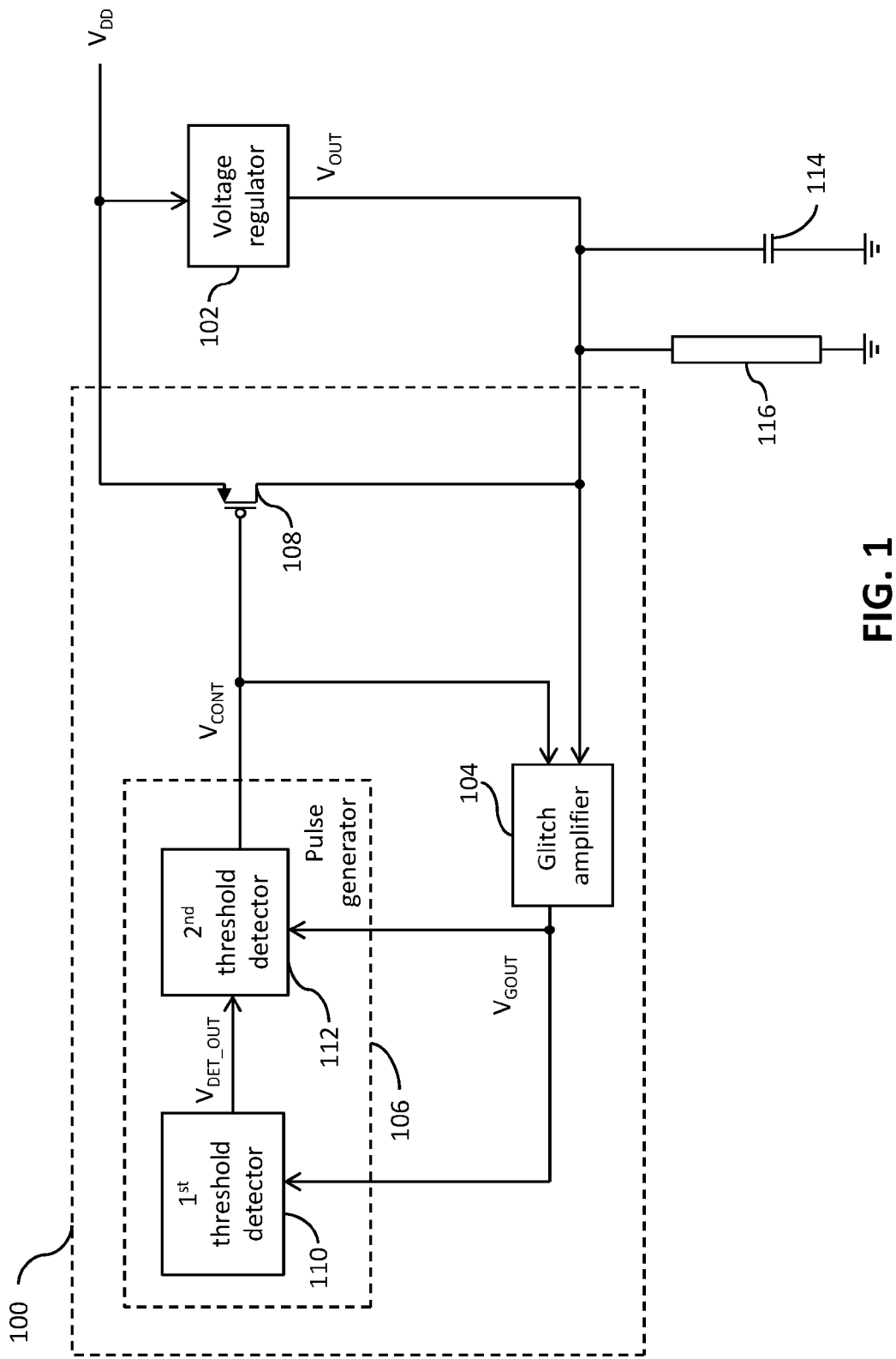
FIG. 1 is a schematic block diagram of a circuit that reduces glitches in an output signal of a voltage regulator in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a circuit connected to a voltage regulator to stabilize an output signal of the voltage regulator. The circuit includes a glitch amplifier, a pulse generator, and a transistor. The glitch amplifier receives the output signal and generates a glitch amplifier output signal. A voltage level of the glitch amplifier output signal is less than a first threshold voltage when there is a positive glitch in the output signal and the voltage level of the glitch amplifier output signal is greater than a second threshold voltage when there is a negative glitch in the output signal. The pulse generator receives the glitch amplifier output signal and generates a control signal. The pulse generator activates the control signal when the voltage level of the glitch amplifier output signal is greater than the second threshold voltage. The transistor has a source connected to a supply voltage, a gate that receives the control signal, and a drain connected to an output terminal of the voltage regulator at which the output signal is provided.

In another embodiment, the present invention provides a circuit connected to a voltage regulator to stabilize an output signal of the voltage regulator. The circuit includes a glitch amplifier, first and second threshold detectors, and a transistor. The glitch amplifier receives the output signal and generates a glitch amplifier output signal. A voltage level of the glitch amplifier output signal is less than a first threshold voltage when there is a positive glitch in the output signal and the voltage level of the glitch amplifier output signal is greater than a second threshold voltage when there is a negative glitch in the output signal. The first threshold detector receives the glitch amplifier output signal and generates a detector output signal. The first threshold detector activates the detector output signal when the voltage level of the glitch amplifier output signal is lower than the first threshold voltage. The second threshold detector receives the glitch amplifier output signal and the detector output signal, and generates a control signal. The transistor has a source connected to a supply voltage, a gate that receives the control signal, and a drain connected to an output terminal of the voltage regulator at which the output signal is provided.

Various embodiments of the present invention provide a circuit for stabilizing an output signal of a voltage regulator. The circuit includes a glitch amplifier, a pulse generator, and a transistor. The glitch amplifier amplifies glitches in the output signal and generates a glitch amplifier output signal. The pulse generator receives the glitch amplifier output signal and generates a control signal. During a positive glitch in the output signal, when a voltage level of the glitch amplifier output signal becomes less than a first threshold voltage, the pulse generator is forced to maintain the control signal at its deactivated state for a period determined by the time during which the voltage level of the glitch amplifier output signal remains less than the first threshold value, and thereby prevents the transistor from generating a current surge. When there is a negative glitch in the output signal, when the voltage level of the glitch amplifier output signal becomes greater than a second threshold voltage, the pulse generator activates the control signal, thereby activating the transistor and providing a compensating current surge to reduce the voltage droop in the output signal. When the control signal is activated, the circuit does not respond to further changes in the output signal for a pulse duration of the control signal.

The circuit can be externally connected to conventional voltage regulators without any modification being made in the design of the voltage regulators. The circuit provides a compensating current surge during a voltage droop in the output signal, and thereby prevents further droop in the output signal.

Referring now to FIG. 1, a schematic block diagram of a circuit 100 in accordance with an embodiment of the present invention is shown. The circuit 100 is connected to a voltage regulator 102 to receive an output signal $V_{OUT}$ and includes a glitch amplifier 104, a pulse generator 106, and a first transistor 108. The pulse generator 106 includes first and second threshold detectors 110 and 112. In one embodiment, the first transistor 108 is a p-channel metal-oxide semiconductor (PMOS) transistor. The voltage regulator 102 generates the output signal $V_{OUT}$ based on a signal received from a supply voltage $V_{DD}$ and is connected to an external decoupling capacitor 114 (hereinafter referred to as "first capacitor 114"). The voltage regulator 102 provides the output signal $V_{OUT}$ to a load impedance 116.

The glitch amplifier 104 is connected to an output terminal of the voltage regulator 102 to receive the output signal $V_{OUT}$. The glitch amplifier 104 also receives a control signal $V_{CONT}$ and generates a glitch amplifier output signal $V_{GOUT}$. The glitch amplifier 104 will be explained in detail in conjunction with FIG. 2 below.

The first threshold detector 110 is connected to the glitch amplifier 104 to receive the glitch amplifier output signal $V_{GOUT}$, and generates a detector output signal $V_{DET\_OUT}$. The first threshold detector 110 will be explained in detail in conjunction with FIG. 3 below.

The second threshold detector 112 is connected to the glitch amplifier 104 and the first threshold detector 110 to receive the glitch amplifier output signal $V_{GOUT}$ and the detector output signal $V_{DET\_OUT}$, respectively, and generates the control signal $V_{CONT}$. The second threshold detector 112 will be explained in detail in conjunction with FIGS. 4 and 5 below.

A source terminal of the first transistor 108 is connected to the supply voltage $V_{DD}$. A gate terminal of the first transistor 108 is connected to the second threshold detector 112 to receive the control signal $V_{CONT}$ and a drain terminal thereof is connected to the output terminal of the voltage regulator 102.

Figure 2:
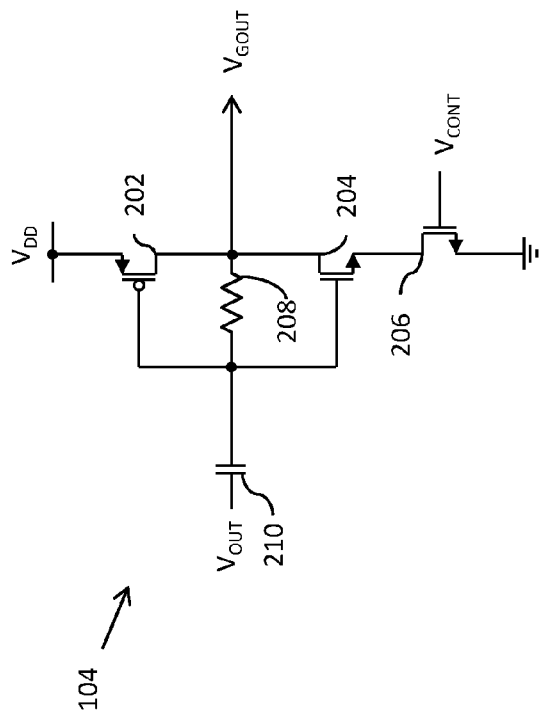
FIG. 2 is a schematic block diagram of a glitch amplifier of the circuit of FIG. 1 in accordance with an embodiment of the present invention.

Referring now to FIG. 2, a schematic block diagram of the glitch amplifier 104 in accordance with an embodiment of the present invention is shown. The glitch amplifier 104 includes second through fourth transistors 202-206, a first resistor 208, and a second capacitor 210. In an embodiment, the second transistor 202 is a PMOS transistor, and the third and fourth transistors 204 and 206 are n-channel MOS (NMOS) transistors.

A source terminal of the second transistor 202 is connected to the supply voltage $V_{DD}$. The second capacitor 210 is connected between the output terminal of the voltage regulator 102 and a gate terminal of the second transistor 202. A gate terminal of the third transistor 204 is connected to the gate terminal of the second transistor 202. A drain terminal of the third transistor 204 is connected to a drain terminal of the second transistor 202 to generate the glitch amplifier output signal $V_{GOUT}$. A source terminal of the third transistor 204 is connected to a drain terminal of the fourth transistor 206. A gate terminal of the fourth transistor 206 is connected to the second threshold detector 112 to receive the control signal $V_{CONT}$, and a source terminal thereof is connected to ground. The first resistor 208 is connected between the gate and drain terminals of the second transistor 202.

Thus, the second and third transistors 202 and 204 receive only glitches present in the output signal $V_{OUT}$. If the output signal $V_{OUT}$ does not include any glitches, the glitch amplifier 104 generates the glitch amplifier output signal $V_{GOUT}$ at a voltage level equal to its threshold voltage (i.e., at a steady state value). When the output signal $V_{OUT}$ includes glitches, the glitch amplifier output signal $V_{GOUT}$ is a superposition of an inverted and amplified version of the output signal $V_{OUT}$ and the steady-state glitch amplifier output signal $V_{GOUT}$.

Figure 3:
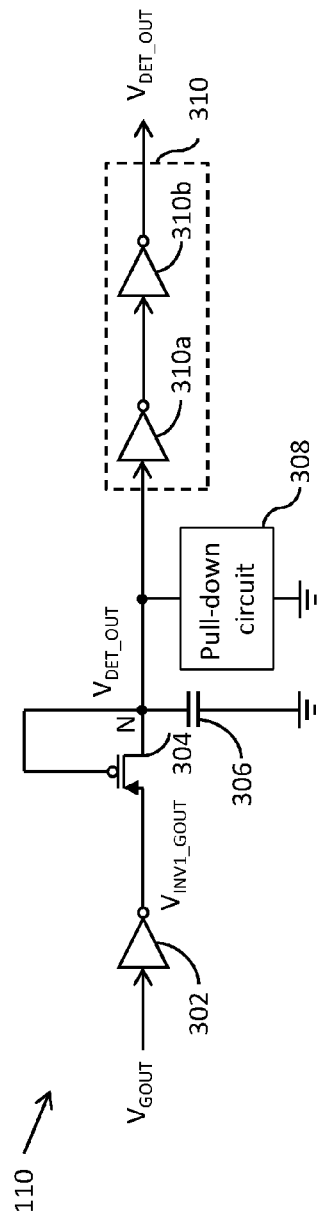
FIG. 3 is a schematic block diagram of a first threshold detector of the circuit of FIG. 1 in accordance with an embodiment of the present invention.

Referring now to FIG. 3, a schematic block diagram of the first threshold detector 110 in accordance with an embodiment of the present invention is shown. The first threshold detector 110 includes a first inverter 302, a fifth transistor 304, a third capacitor 306, and a pull-down circuit 308.

The first inverter 302 is connected to the glitch amplifier 104 to receive the glitch amplifier output signal $V_{GOUT}$, and generates a first inverted version of the glitch amplifier output signal $V_{INV1\_GOuT}$ (hereinafter referred to as "first inverted glitch amplifier output signal $V_{INV1\_GOUT}$").

A source terminal of the fifth transistor 304 is connected to the first inverter 302 to receive the first inverted glitch amplifier output signal $V_{INV1\_GOUT}$. A gate terminal of the fifth transistor 304 is connected to the drain terminal thereof. Thus, the fifth transistor 304 functions as a diode. The third capacitor 306 is connected between the drain terminal of the fifth transistor 304 and ground. The pull-down circuit 308 is connected between a node 'N' and ground. The node 'N' is formed at the connection of the drain of the fifth transistor 304 and the third capacitor 306, and the detector output signal $V_{DET\_OUT}$ is output from the node 'N'. In the presently preferred embodiment, the first threshold detector 110 includes a plurality of inverters 310, including second and third inverters 310a and 310b, to buffer the detector output signal $V_{DET\_OUT}$.

Figure 4:
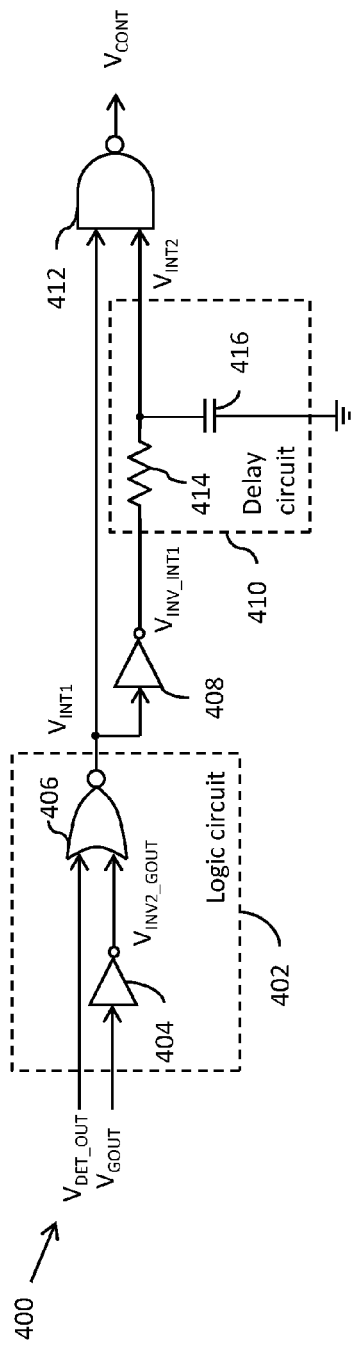
FIG. 4 is a schematic block diagram of a second threshold detector of the circuit of FIG. 1 in accordance with an embodiment of the present invention.

Referring now to FIG. 4, a schematic block diagram of an embodiment of a second threshold detector 400 in accordance with an embodiment of the present invention is shown. The second threshold detector 400 includes a logic circuit 402 that includes a fourth inverter 404 and a first logic gate 406. The second threshold detector 400 further includes a fifth inverter 408, a delay circuit 410, and a second logic gate 412. In one embodiment, the first logic gate 406 is a NOR gate and the second logic gate 412 is a NAND gate.

The fourth inverter 404 is connected to the glitch amplifier 104 to receive the glitch amplifier output signal $V_{GOUT}$ and generates a second inverted version of the glitch amplifier output signal $V_{INV2\_GOUT}$ (hereinafter referred to as "second inverted glitch amplifier output signal $V_{INV2\_GOUT}$").

The first logic gate 406 is connected to the first threshold detector 110 and the fourth inverter 404 to receive the detector output signal $V_{DET\_OUT}$ and the second inverted glitch amplifier output signal $V_{INV2\_GOUT}$, respectively, and generates a first intermediate signal $V_{INT1}$.

The fifth inverter 408 is connected to the first logic gate 406 to receive the first intermediate signal $V_{INT1}$ and generates an inverted version of the first intermediate signal $V_{INV\_INT1}$ (hereinafter referred to as "inverted first intermediate signal $V_{INV\_INT1}$").

The delay circuit 410 is connected to the fifth inverter 408 to receive the inverted first intermediate signal $V_{INV\_INT1}$, and generates a second intermediate signal $V_{INT2}$. In the presently preferred embodiment, the delay circuit 410 is a low-pass filter formed by using a second resistor 414 and a fourth capacitor 416.

The second logic gate 412 is connected to the first logic gate 406 and the delay circuit 410 to receive the first and second intermediate signals $V_{INT1}$ and $V_{INT2}$, respectively, and generates the control signal $V_{CONT}$.

During a positive glitch in the output signal $V_{OUT}$, when the voltage level of the glitch amplifier output signal $V_{GOUT}$ becomes less than a first threshold voltage (i.e., the threshold voltage of the first inverter 302), the first threshold detector 110 outputs the detector output signal $V_{DET\_OUT}$ as a positive pulse. The time period during which the detector output signal $V_{DET\_OUT}$ remains high depends on the rate at which the third capacitor 306 is discharged by the pull-down circuit 308.

When the second threshold detector 400 receives the detector output signal $V_{DET\_OUT}$, the second threshold detector 400 is forced to maintain the control signal $V_{CONT}$ at its deactivated state for a pulse duration of the detector output signal $V_{DET\_OUT}$, i.e., for a duration of the positive pulse. Thus, the first transistor 108 is maintained in a disable state and does not provide a current surge when the control signal $V_{CONT}$ is in the deactivated state.

During a negative glitch in the output signal $V_{OUT}$, when the voltage level of the glitch amplifier output signal $V_{GOUT}$ becomes greater than a second threshold voltage (i.e., the threshold voltage of the fourth inverter 404, which is greater than the threshold voltage of the first inverter 302), the first threshold detector 110 outputs a logic low detector output signal $V_{DET\_OUT}$. Thus, the second threshold detector 400 activates the control signal $V_{CONT}$, thereby enabling the first transistor 108 for a pulse duration of the control signal $V_{CONT}$. This causes the first transistor 108 to output a compensating current surge and reduce the voltage droop in the output signal $V_{OUT}$. The time period for which the control signal $V_{CONT}$ remains activated depends on the discharging rate of the fourth capacitor 416. Further, the activated control signal $V_{CONT}$ causes the fourth transistor 206 to be disabled, thereby latching an output node of the glitch amplifier 104 to the supply voltage $V_{DD}$. The glitch amplifier 104 thus becomes insensitive to any further glitches in the output signal $V_{OUT}$ for the time period the control signal $V_{CONT}$ is active. This prevents the glitch amplifier 104 from generating an oscillating glitch amplifier output signal $V_{GOUT}$, and thereby prevents the circuit 100 from becoming unstable.

Thus, when the control signal $V_{CONT}$ is activated the circuit 100 does not respond to further changes in the output signal $V_{OUT}$ for the pulse duration of the control signal $V_{CONT}$.

Figure 5:
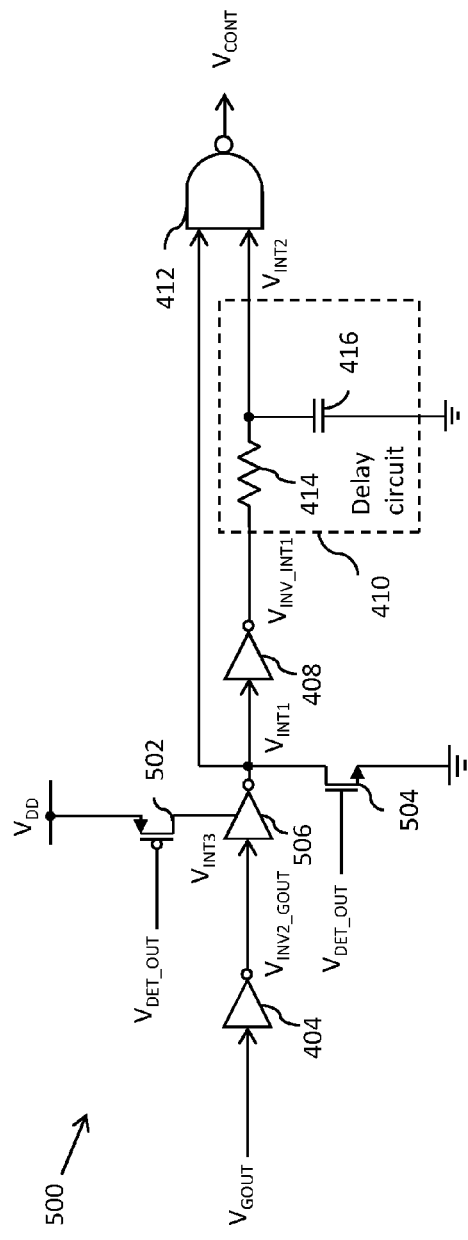
FIG. 5 is a schematic block diagram of a second threshold detector of FIG. 1 in accordance with another embodiment of the present invention.

Referring now to FIG. 5, a schematic block diagram of a second threshold detector 500 in accordance with another embodiment of the present invention is shown. The second threshold detector 500 is functionally similar to the second threshold detector 400 and includes the fourth and fifth inverters 404 and 408, the delay circuit 410, and the second logic gate 412. Instead of the first logic gate 406, the second threshold detector 500 includes sixth and seventh transistors 502 and 504, and a tri-state inverter 506. The sixth and seventh transistors 502 and 504 are PMOS and NMOS transistors, respectively.

A source terminal of the sixth transistor 502 is connected to the supply voltage $V_{DD}$. A gate terminal of the sixth transistor 502 is connected to the first threshold detector 110 to receive the detector output signal $V_{DET\_OUT}$, and a drain terminal thereof generates a third intermediate signal $V_{INT3}$.

The tri-state inverter 506 is connected to the fourth inverter 404 and the drain of the sixth transistor 502 to receive the second inverted glitch amplifier output signal $V_{INV2\_GOUT}$ and the third intermediate signal $V_{INT3}$, respectively. A gate terminal of the seventh transistor 504 is connected to the first threshold detector 110 to receive the detector output signal $V_{DET\_OUT}$. A drain terminal of the seventh transistor 504 is connected to the tri-state inverter 506 to output the first intermediate signal $V_{INT1}$, and a source terminal thereof is connected to ground.

The circuit 100 can be externally connected to a conventional voltage regulator, i.e., the voltage regulator 102, without needing any modification in the design of the voltage regulator 102. The circuit 100 provides the compensating current surge during event of a voltage droop in the output signal $V_{OUT}$, and thereby prevents further droop in the output signal $V_{OUT}$. It will be apparent to a person skilled in the art that the first and second resistors 208 and 414 can be implemented by using a MOS transistor. Further, the pull-down circuit 308 can be implemented using a resistor or a transistor.

It will be understood by those with skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A circuit for stabilizing an output signal of a voltage regulator, the circuit comprising:
    a glitch amplifier, connected to the voltage regulator, that receives the output signal and generates a glitch amplifier output signal, wherein a voltage level of the glitch amplifier output signal is less than a first threshold voltage when there is a positive glitch in the output signal and greater than a second threshold voltage when there is a negative glitch in the output signal;
    a pulse generator, connected to the glitch amplifier, that receives the glitch amplifier output signal and generates a control signal, wherein the pulse generator activates the control signal when the voltage level of the glitch amplifier output signal is greater than the second threshold voltage; and
    a first transistor having a source connected to a supply voltage, a gate connected to the pulse generator for receiving the control signal, and a drain connected to an output terminal of the voltage regulator at which the output signal is provided, wherein the glitch amplifier comprises:
        a second transistor having a source connected to the supply voltage;
        a capacitor connected between the output terminal of the voltage regulator and a gate of the second transistor;
        a resistor connected between the gate of the second transistor and a drain of the second transistor; and
        a third transistor having a gate connected to the gate of the second transistor, a drain connected to the drain of the second transistor for generating the glitch amplifier output signal, and a source connected to ground.

2. The circuit of claim 1, wherein when the pulse generator activates the control signal, the first transistor is turned on for a pulse duration of the control signal.

3. The circuit of claim 1, wherein the source of the third transistor is connected to ground by way of a fourth transistor, and wherein a gate of the fourth transistor is connected to the pulse generator for receiving the control signal.

4. The circuit of claim 1, wherein the pulse generator comprises:
   a first threshold detector, connected to the glitch amplifier, that receives the glitch amplifier output signal and generates a detector output signal, wherein the first threshold detector activates the detector output signal when the voltage level of the glitch amplifier output signal is less than the first threshold voltage; and
   a second threshold detector connected to the glitch amplifier and the first threshold detector for receiving the glitch amplifier output signal and the detector output signal, respectively, and generating the control signal.

5. The circuit of claim 4, wherein when the first threshold detector activates the detector output signal, the second threshold detector deactivates the control signal for a pulse duration of the detector output signal.

6. The circuit of claim 4, wherein the first threshold detector comprises:
   an inverter, connected to the glitch amplifier, that receives the glitch amplifier output signal and generates an inverted version of the glitch amplifier output signal, wherein the first threshold voltage corresponds to a threshold of the inverter;
   a fourth transistor having a source connected to the inverter for receiving the inverted version of the glitch amplifier output signal and a gate connected to its drain;
   a capacitor connected between the drain of the fourth transistor and ground; and
   a pull-down circuit connected between a node and ground, wherein the node is formed at a connection of the drain of the fourth transistor and the capacitor, and the detector output signal is generated at the node.

7. The circuit of claim 4, wherein the second threshold detector comprises:
   an inverter, connected to the glitch amplifier, that receives the glitch amplifier output signal and generates an inverted version of the glitch amplifier output signal, wherein the second threshold voltage corresponds to a threshold of the inverter;
   a fifth transistor having a source connected to the supply voltage, a gate connected to the first threshold detector for receiving the detector output signal, and a drain that generates a first intermediate signal;
   a tri-state inverter, connected to the inverter and the drain of the fifth transistor, that receives the inverted version of the glitch amplifier output signal and the first intermediate signal;
   a sixth transistor having a gate connected to the first threshold detector for receiving the detector output signal, a drain connected to the tri-state inverter for generating a second intermediate signal, and a source connected to ground;
   a delay circuit that receives an inverted version of the second intermediate signal and outputs a third intermediate signal; and
   a logic gate that receives the second and third intermediate signals and generates the control signal.

8. The circuit of claim 4, wherein the second threshold detector comprises:
   a logic circuit, connected to the glitch amplifier and the first threshold detector, that receives the glitch amplifier output signal and the detector output signal, and generates a first intermediate signal;
   a delay circuit that receives an inverted version of the first intermediate signal and outputs a second intermediate signal; and
   a first logic gate that receives the first and second intermediate signals, and generates the control signal.

9. The circuit of claim 8, wherein the logic circuit comprises:
   an inverter, connected to the glitch amplifier, that receives the glitch amplifier output signal and generates an inverted version of the glitch amplifier output signal, wherein the second threshold voltage corresponds to a threshold of the inverter; and
   a second logic gate that receives the detector output signal and the inverted version of the glitch amplifier output signal, and generates the first intermediate signal.

10. A circuit for stabilizing an output signal of a voltage regulator, the circuit comprising:
    a glitch amplifier, connected to the voltage regulator, that receives the output signal, and generates a glitch amplifier output signal, wherein a voltage level of the glitch amplifier output signal is less than a first threshold voltage when there is a positive glitch in the output signal and greater than a second threshold voltage when there is a negative glitch in the output signal;
    a first threshold detector, connected to the glitch amplifier, that receives the glitch amplifier output signal, and generates a detector output signal, wherein the first threshold detector activates the detector output signal when the voltage level of the glitch amplifier output signal is less than the first threshold voltage;
    a second threshold detector, connected to the glitch amplifier and the first threshold detector, that receives the glitch amplifier output signal and the detector output signal, and generates a control signal; and
    a first transistor having a source connected to a supply voltage, a gate connected to the second threshold detector for receiving the control signal, and a drain connected to an output terminal of the voltage regulator at which the output signal is provided, wherein the second threshold detector comprises:
    a logic circuit, connected to the glitch amplifier and the first threshold detector, that receives the glitch amplifier output signal and the detector output signal, and generates a first intermediate signal;
    a delay circuit that receives an inverted version of the first intermediate signal and outputs a second intermediate signal; and
    a first logic gate that receives the first and second intermediate signals, and generates the control signal.

11. The circuit of claim 10, wherein when the first threshold detector activates the detector output signal, the second threshold detector deactivates the control signal for a pulse duration of the detector output signal.

12. The circuit of claim 10, wherein the second threshold detector activates the control signal when the voltage level of the glitch amplifier output signal is greater than the second threshold voltage.

13. The circuit of claim 12, wherein when the second threshold detector activates the control signal, the first transistor is enabled for a pulse duration of the control signal.

14. The circuit of claim 10, wherein the glitch amplifier comprises:
- a second transistor having a source connected to the supply voltage;
- a capacitor connected between the output terminal of the voltage regulator and a gate of the second transistor;
- a resistor connected between the gate of the second transistor and a drain of the second transistor; and
- a third transistor having a gate connected to the gate of the second transistor, a drain connected to the drain of the second transistor for generating the glitch amplifier output signal, and a source connected to ground.

15. The circuit of claim 14, wherein the source of the third transistor is connected to ground by way of a fourth transistor, and wherein a gate of the fourth transistor is connected to the second threshold detector for receiving the control signal.

16. The circuit of claim 10, wherein the first threshold detector comprises:
- an inverter, connected to the glitch amplifier, that receives the glitch amplifier output signal and generates an inverted version of the glitch amplifier output signal, wherein the first threshold voltage corresponds to a threshold of the inverter;
- a second transistor having a source connected to the inverter for receiving the inverted version of the glitch amplifier output signal and a gate connected to its drain;
- a capacitor connected between the drain of the second transistor and ground; and
- a pull-down circuit connected between a node and ground, wherein the node is formed at a connection of the drain of the second transistor and the capacitor, and the detector output signal is generated at the node.

17. The circuit of claim 10, wherein the logic circuit comprises:
- an inverter, connected to the glitch amplifier, that receives the glitch amplifier output signal and generates an inverted version of the glitch amplifier output signal, wherein the second threshold voltage corresponds to a threshold of the inverter; and
- a second logic gate that receives the detector output signal and the inverted version of the glitch amplifier output signal, and generates the first intermediate signal.

\* \* \* \* \*